(12) United States Patent
DeFranco et al.

(10) Patent No.: US 7,855,559 B2
(45) Date of Patent: Dec. 21, 2010

(54) CIRCUIT AND APPARATUS FOR DECOUPLING RF SURFACE COILS

(75) Inventors: Anthony D. DeFranco, Pittsburgh, PA (US); Matthew M. Meiller, Sussex, WI (US); Robert S. Stormont, Hartland, WI (US); Dashen Chu, Hartland, WI (US); Paul D. Haig, Milwaukee, WI (US)

(73) Assignee: General Electric Co., Schenectady, NY (US)

( * ) Notice: Subject to any disclaimer, the term of this patent is extended or adjusted under 35 U.S.C. 154(b) by 295 days.

(21) Appl. No.: 12/241,257

(22) Filed: Sep. 30, 2008

(65) Prior Publication Data
US 2010/0079139 A1    Apr. 1, 2010

(51) Int. Cl.
*G01V 3/00* (2006.01)
(52) U.S. Cl. .................................................. 324/322
(58) Field of Classification Search ......... 324/300–322; 600/410–435; 333/219–235; 343/739–752, 343/767–788, 850–873, 876, 904–916, 700 MS
See application file for complete search history.

(56) References Cited

U.S. PATENT DOCUMENTS

| | | | | |
|---|---|---|---|---|
| 5,136,244 | A * | 8/1992 | Jones et al. | 324/318 |
| 5,666,055 | A * | 9/1997 | Jones et al. | 324/318 |
| 5,804,969 | A * | 9/1998 | Lian et al. | 324/318 |
| 6,512,374 | B1 * | 1/2003 | Misic et al. | 324/319 |
| 6,580,274 | B2 * | 6/2003 | Sato | 324/318 |
| 6,747,452 | B1 * | 6/2004 | Jectic et al. | 324/311 |
| 6,825,664 | B2 * | 11/2004 | Kwok et al. | 324/318 |

(Continued)

FOREIGN PATENT DOCUMENTS

EP    0390476 A    10/1990

(Continued)

OTHER PUBLICATIONS

Streif Jorg U G et al: "A coil combination for magnetic resonance perfusion imaging of mice in vivo at 7 T" Review of Scientific Instruments, AIP, Melville, NY, US, vol. 74, No. 5, May 1, 2003, pp. 2843-2848, XP012040846 ISSN: 0034-6748.

(Continued)

*Primary Examiner*—Melissa J Koval
*Assistant Examiner*—Dixomara Vargas

(57) ABSTRACT

A decoupling circuit for a radio frequency (RF) surface coil having a plurality of tuning capacitors includes at least two decoupling points and a DC source coupled to the at least two decoupling points. Each decoupling point is associated with one of the plurality of tuning capacitors. Each decoupling point includes a decoupling inductor connected in parallel with a tuning capacitor, a diode connected in series with the decoupling inductor and in parallel with the tuning capacitor, a resistor connected in parallel with the diode and at least one isolating inductor connected between the resistor and the diode to RF isolate the resistor. The value of the resistor in each decoupling point is selected to maintain a high quality factor (Q) of the RF surface coil and to reduce the switching speed of the decoupling circuit.

14 Claims, 3 Drawing Sheets

U.S. PATENT DOCUMENTS

| | | | |
|---|---|---|---|
| 6,850,067 B1 * | 2/2005 | Burl et al. | 324/322 |
| 7,248,051 B2 * | 7/2007 | Wang et al. | 324/322 |
| 7,501,828 B1 * | 3/2009 | Wong et al. | 324/322 |
| 2003/0189426 A1 | 10/2003 | Kwok et al. | |

FOREIGN PATENT DOCUMENTS

| | | |
|---|---|---|
| JP | 10057338 A | 3/1998 |
| JP | 2007097971 A | 4/2007 |

OTHER PUBLICATIONS

S.M. Varosi et al.: "An Investigation of PIN Diode Failure Related to High Peak Power" Proc. Intl.Soc.Mag. Reson.Med., 1998, p. 2053, XP002550181.

International Search Report issued in connection with corresponding PCT Application No. PCT/US2009/054990 on Oct. 30, 2009.

* cited by examiner

CIRCUIT AND APPARATUS FOR DECOUPLING RF SURFACE COILS

FIELD OF THE INVENTION

The present invention relates generally to a magnetic resonance imaging (MRI) system and in particular to a circuit and apparatus for decoupling RF surface coils during transmission of RF excitation signals.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

As mentioned, radio frequency (RF) coils are used in an MRI system to transmit RF excitation signals and to receive MR signals emitted by an imaging subject. Various types of RF coils may be utilized in an MRI system such as a whole-body RF coil and RF surface (or local) coils. Typically, the whole-body RF coil is used for transmitting RF excitation signals. One or more (e.g., an array) surface coils can be used as receive coils to detect MRI signals. Surface coils may be placed in close proximity to a region of interest in a subject and typically yield a higher signal-to-noise ratio (SNR) than the whole-body RF coil. During transmission of RF excitation signals, the surface coils can couple to the whole-body RF coil causing distortion of the excitation field (B1) and affecting image quality. Accordingly, the surface coil (or coils) is disabled, or decoupled, during the transmit (Tx) mode (in which the whole-body RF coil transmits the RF excitation signals) to reduce distortion of the excitation (B1) field. The surface coils are then enabled when the MRI system switches to a receive (Rx) mode to receive the induced MRI signals.

Various decoupling schemes and circuits have been developed for surface RF coils to ensure that the surface coils switch between enabled in the receive mode and disabled in the transmit mode. Developments in MR applications, for example, using the transmit body coils B1 field for calibration, have resulted in more stringent requirements for less B1 distortion during the transmit mode to achieve B1 homogeneity. In addition, faster imaging techniques that have been developed create a need for reduced switching times for RF surface coils between enabled in the receive mode and disabled in the transmit mode. One method to reduce the B1 distortion is to include decoupling circuitry at more points in a surface coil. However, conventional decoupling schemes typically have an associated lowering of the quality factor (Q) of the surface coils and an associated delay in switching times as the number of decoupling points in a surface coil increases.

One conventional decoupling scheme switches an inductor across one or more tuning capacitors of a surface coil. Typically, the switching is accomplished with diodes. A resistor can be placed directly across each switching diode to remove unwanted charge. The resistance value of the resistor used can affect both the quality factor (Q) of the surface coil and the switching speed of the decoupling circuit. Currently, the choice of resistor value can have two conflicting impacts on the performance of an RF surface coil. The use of a higher value resistor favors higher Q of the surface coil in receive mode at the cost of having a longer switching time. The use of a lower value resistor favors shorter switching time at the cost of Q in the surface coil in the receive mode.

It would be desirable to provide a decoupling circuit for an RF surface coil that provides faster switching speeds while maintaining a high Q for the surface coil.

BRIEF DESCRIPTION OF THE INVENTION

In accordance with an embodiment, a decoupling circuit for a radio frequency (RF) surface coil having a plurality of tuning capacitors includes at least two decoupling points, each decoupling point associated with one of the plurality of tuning capacitors and a DC source coupled to the at least two decoupling points. Each decoupling point includes a decoupling inductor connected in parallel with a tuning capacitor, a diode connected in series with the decoupling inductor and in parallel with the tuning capacitor, a resistor connected in parallel with the diode and at least one isolating inductor connected between the resistor and the diode to RF isolate the resistor.

In accordance with another embodiment, a radio frequency (RF) surface coil assembly for a magnetic resonance imaging (MRI) includes a radio frequency (RF) coil comprising a plurality of tuning capacitors, at least two decoupling points coupled to the RF coil, each decoupling point associated with one of the plurality of tuning capacitors and a DC source coupled to the at least two decoupling points. Each decoupling point includes a decoupling inductor connected in parallel with a tuning capacitor, a diode connected in series with the decoupling inductor and in parallel with the tuning capacitor, a resistor connected in parallel with the diode and at least one isolating inductor connected between the resistor and the diode.

In accordance with another embodiment, a resonance assembly includes a superconducting magnet, a gradient coil assembly disposed within an inner diameter of the superconducting magnet, an RF body coil disposed within an inner diameter of the gradient coil assembly, the RF body coil configured to transmit RF excitation signals during a transmit mode, an RF surface coil disposed within an inner diameter of the RF body coil and near an imaging subject, the RF surface coil having a plurality of tuning capacitors and configured to receive MR signals emitted from the imaging subject during a receive mode, a decoupling circuit coupled to RF surface coil and configured to disable the RF surface coil during the transmit mode and enable the RF surface coil during the receive mode, the decoupling circuit including at least two decoupling points and a DC source coupled to the at least two decoupling points. Each decoupling point is associated with one of the plurality of tuning capacitors and includes a decoupling inductor connected in parallel with a tuning capacitor, a diode connected in series with the decoupling inductor and in parallel with the tuning capacitor, a resistor connected in parallel with the diode, and at least one isolating inductor connected between the resistor and the diode to RF isolate the resistor.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
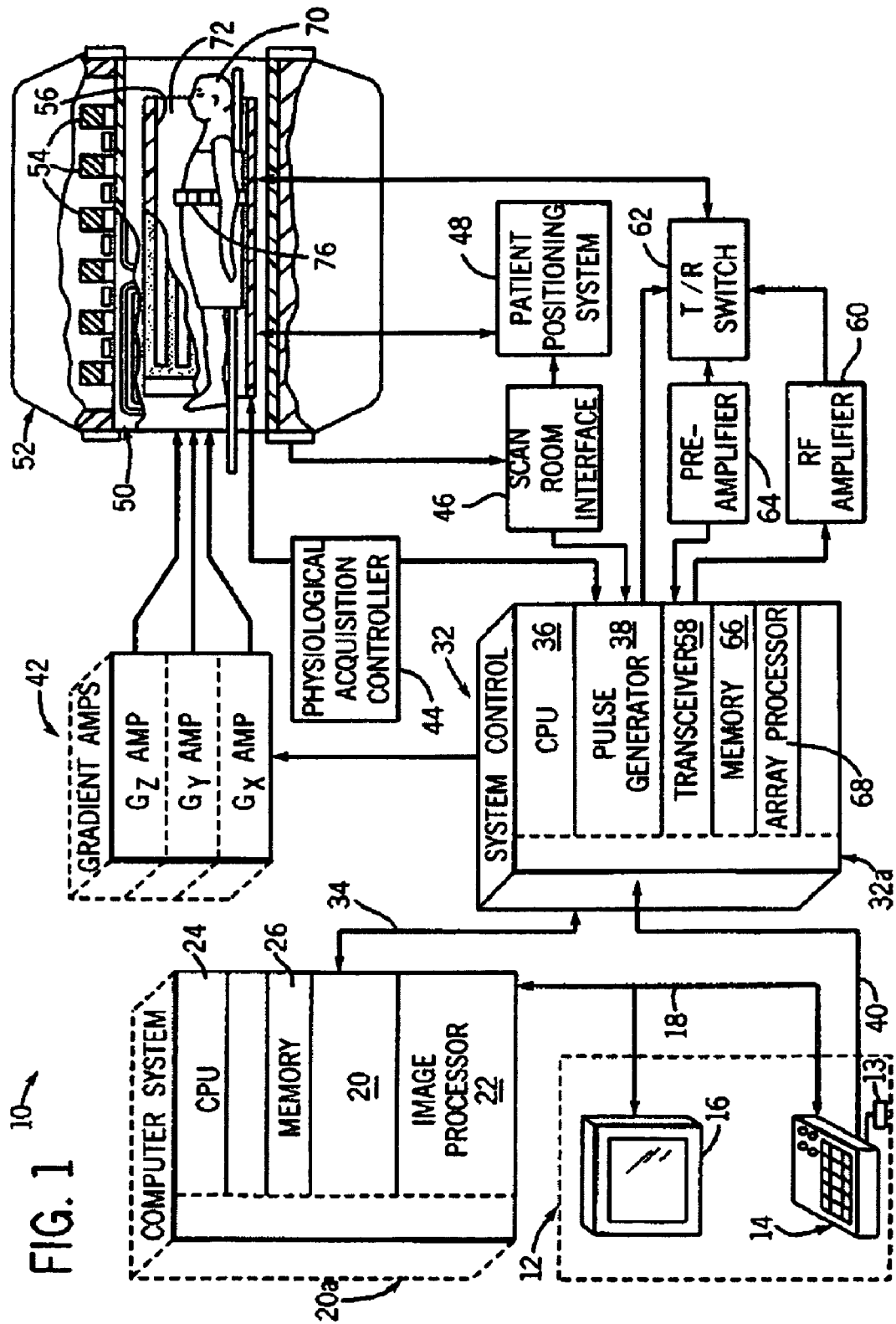
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or local imaging coils 76 or both. The coils 56, 76 of the RF coil assembly may be configured for both transmitting and receiving or for transmit-only or receive-only. The surface coils 76 can be an array of RF surface coils in which each coil (or coil element) separately detects the MRI signals. Such RF surface coil arrays are well-known in the art.

A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
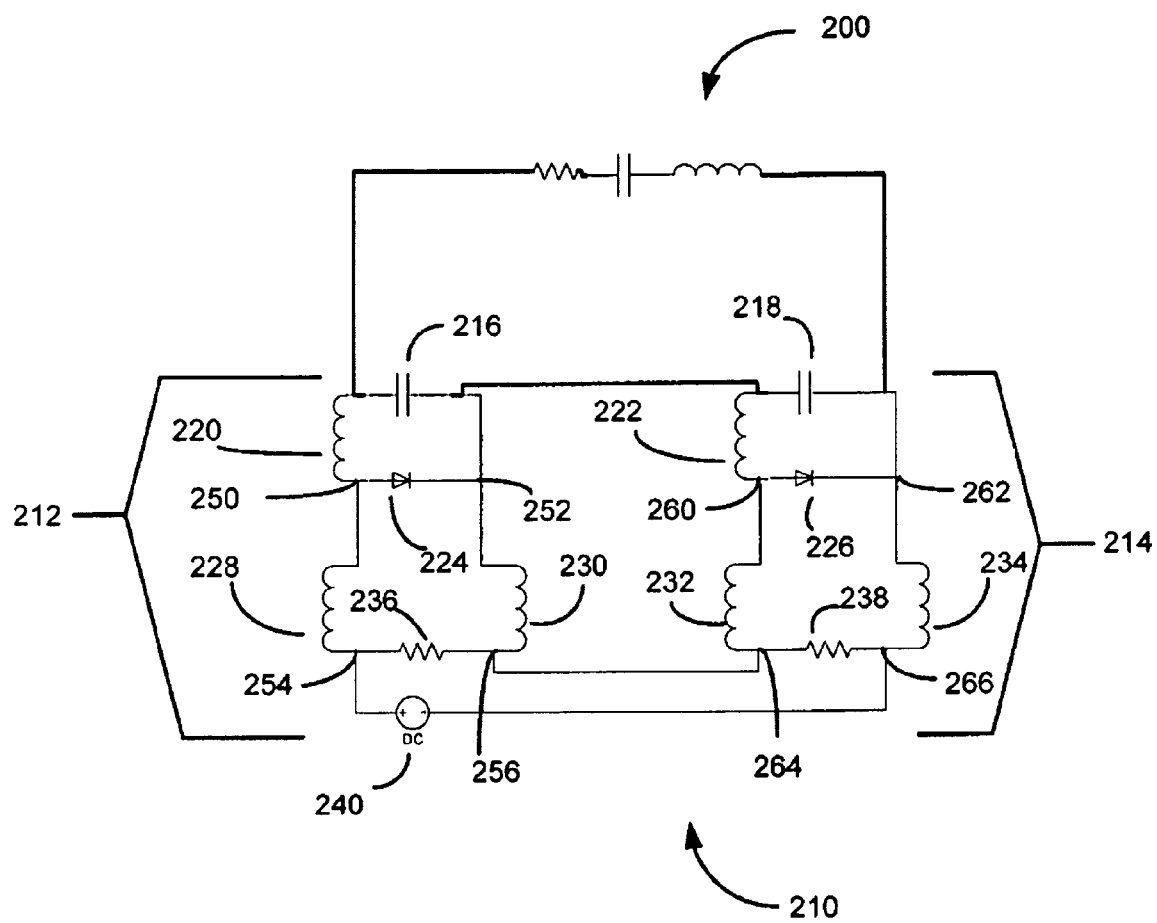
FIG. 2 is a circuit diagram of a decoupling circuit for an RF surface coil in accordance with an embodiment.

As mentioned above, an RF body coil 56 may be used in a transmit mode to transmit RF excitation signals and a surface coil or coils (e.g., an array of surface coils) 76 may be used in a receive mode to detect the signals emitted by the subject. A decoupling circuit (or circuits) is provided to decouple, or disable, the surface coil or coils during the transmit mode when the RF body coil 56 is transmitting RF excitation signals. In an embodiment where a plurality (or array) of surface coils is used, a decoupling circuit may be provided for each surface coil. FIG. 2 is a schematic circuit diagram of a decoupling circuit for an RF surface coil in accordance with an embodiment. An RF surface coil 200 is shown with a decoupling circuit 210 that has a first decoupling point 212 and a second decoupling point 214. In FIG. 2, a decoupling circuit 210 with two decoupling points 212, 214 is shown, however, it should be understood that decoupling circuits with more than two decoupling points can be utilized. The number of decoupling points used may be based on, for example, the B1 transmitting field distortion requirement or the size and/or complexity of the surface coil geometry.

Each decoupling point 212, 214 includes and is associated with one of the tuning capacitors of the RF coil 200. For example, in FIG. 2 the first decoupling point 212 includes a first tuning capacitor 216 and the second decoupling point 214 includes a second tuning capacitor 218. The first decoupling point 212 also includes a decoupling inductor 220, a PIN diode 224, isolating inductors (or RF chokes) 228, 230 and a resistor 236. The PIN diode 224 is connected in series with the decoupling inductor 220 and the series-connected PIN diode 224 and decoupling inductor 220 are connected in parallel across the first tuning capacitor 216. The resistor 236 is connected across the PIN diode 224 and the isolating inductors 228, 230 are connected between the resistor 236 and the PIN diode 224. In particular, a first isolating inductor 228 is connected between a first terminal 250 of the PIN diode 224 and a first end 254 of the resistor 236 and a second isolating inductor 230 is connected between a second terminal 252 of the PIN diode 224 and a second end 256 of the resistor 236. In a similar manner, the second decoupling point 214 also includes a decoupling inductor 222, a PIN diode 226, isolating inductors (or RF chokes) 232, 234 and a resistor 238. The PIN diode 226 is connected in series with the decoupling inductor 222 and the series-connected PIN diode 226 and decoupling inductor 222 are connected in parallel across the second tuning capacitor 218. The resistor 238 is connected across the PIN diode 226 and the isolating inductors 232, 234 are connected between the resistor 238 and the PIN diode 226. In particular, a first isolating inductor 232 is connected between a first terminal 260 of the PIN diode 226 and a first end 264 of the resistor 238 and a second isolating inductor 234 is connected between a second terminal 262 of the PIN diode 226 and a second end 266 of the resistor 238. A DC source 240 is connected to the first decoupling circuit 212 and the second decoupling circuit 214.

In operation, decoupling points 212, 214 decouple (or disable) the RF surface coil during a transmit mode and enable the RF surface coil 200 during a receive mode. Referring to the first decoupling point 212, the PIN diode 224 is used to switch the decoupling inductor 220 across the tuning capacitor 216 during the transmit mode. In particular, during the transmit mode, the DC source 240 is used to apply a forward bias voltage across the PIN diode 224 to turn the PIN diode 224 on and connect the decoupling inductor 220 to the tuning capacitor 216. The decoupling inductor 220 is resonated with the capacitor 216 and forms a local parallel resonance circuit. The parallel resonance blocks current flow through the portion of the surface coil corresponding to capacitor 216 and decouples the surface coil 200. As mentioned, decoupling the surface coil 200 prevents distortion of the RF body coil B1 field. In the receive mode, a reverse bias voltage is applied to the PIN diode 224 so that the PIN diode 224 acts as a high resistance to virtually disconnect the decoupling inductor 220 from the capacitor 216 (and RF surface coil 200) to enable the RF surface coil 200 to resonate at an imaging frequency to receive MR signals.

Resistor 236 is used to maintain a high quality factor (Q) for the RF surface coil 200 during the receive mode and to discharge voltage from the PIN diode 224 when the RF surface coil 200 is switched from disabled in the transmit mode to enabled in the receive mode. Isolating inductors (or RF chokes) 228, 230 are inserted between the resistor 236 and PIN diode 224 to RF isolate the resistor 236 from the resonating surface coil 200 and prevent the resistor 236 from loading the surface coil 200 during the receive mode. Accordingly, the choice of resistance value (R) for the resistor 236 will not affect the quality factor (Q) of the surface coil 200. To maintain a high Q of the surface coil 200, the resistance value of the resistor 236, 238 in each decoupling point 212, 214 of the decoupling circuit 210 is the same value. By using the same resistance value for the resistor in each decoupling point in the decoupling circuit, the reverse-bias voltage is equally distributed across each PIN diode 224, 226 in each decoupling point of the decoupling circuit 210. The value of the resistor 236, 238 can be selected solely to affect the switching time. Accordingly, a small value resistor 236, 238 can be used in each decoupling point 212, 214 to provide a faster switching time for the surface coil 200 between the disabled and enabled states. The second decoupling point 214 operates in a similar manner as described above with respect to the first decoupling point 212. In a decoupling circuit with more than two decoupling points, each decoupling point will operate in a similar manner as described above with respect to the first decoupling point 212.

Figure 3:
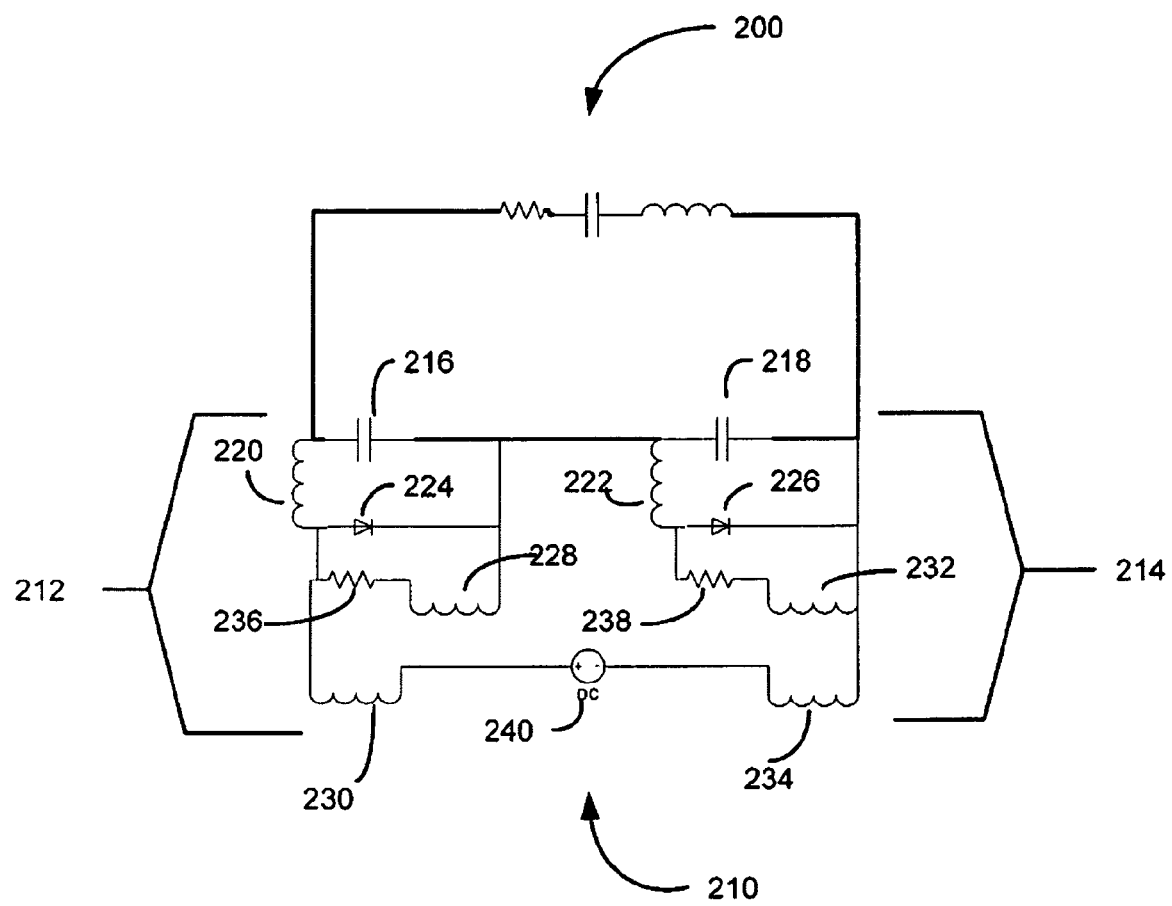
FIG. 3 is a circuit diagram of a decoupling circuit for an RF surface coil in accordance with an embodiment.

FIG. 3 is a circuit diagram of a decoupling circuit for an RF surface coil in accordance with an embodiment. The decoupling circuit 210 shown in FIG. 3 operates in a similar manner as the decoupling circuit described above with respect to FIG. 2. In FIG. 3, the isolating inductors (or RF chokes) 228, 230 in the first decoupling point 212 are connected in series with the resistor 236 and the isolating inductors (or RF chokes) 232, 234 in the second decoupling point 214 are connected in series with the resistor 238. As mentioned above, the isolating inductors RF isolate the resistors from the resonating surface coil 200 and prevent the resistors from loading the surface coil 200 during the receive mode. Accordingly, the value of the resistors 236, 238 can be selected to provide a faster switching time while maintaining the Q of the surface coil 200.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. A decoupling circuit for a radio frequency (RF) surface coil in a magnetic resonance imaging (MRI) system, the RF surface coil having a plurality of tuning capacitors, the decoupling circuit comprising:
   at least two decoupling points coupled to the RF surface coil in said magnetic resonance imaging system, each decoupling point associated with one of the plurality of tuning capacitors and comprising:
      a decoupling inductor connected in parallel with a tuning capacitor;
      a diode connected in series with the decoupling inductor and in parallel with the tuning capacitor;
      a resistor connected in parallel with the diode; and
      at least one isolating inductor connected between the resistor and the diode to isolate the resistor; and
   a DC source coupled to the at least two decoupling points.

2. A decoupling circuit according to claim 1, wherein the resistor has a first end and a second end and the diode has a first terminal and a second terminal and the at least one isolating inductor comprises:
   a first isolating inductor connected between the first end of the resistor and the first terminal of the diode; and
   a second isolating inductor connected between the second end of the resistor and the second terminal of the diode.

3. A decoupling circuit according to claim 1, wherein the at least one isolating inductor is connected in series with the resistor.

4. A decoupling circuit according to claim 1, wherein the diode is a PIN diode.

5. A decoupling circuit according to claim 1, wherein the resistor has a resistance value and the resistance value is selected to reduce a switching time of the decoupling circuit.

6. A decoupling circuit according to claim 1, wherein the resistor has a resistance value and the resistance value of the resistor in each decoupling point is the same.

7. A radio frequency (RF) surface coil apparatus for a magnetic resonance imaging (MRI) system, the RF surface coil assembly comprising:
   a radio frequency (RF) coil of said magnetic resonance system, the RF coil comprising a plurality of tuning capacitors;
   at least two decoupling points coupled to the RF coil, each decoupling point associated with one of the plurality of tuning capacitors and comprising:
      a decoupling inductor connected in parallel with a tuning capacitor;
      a diode connected in series with the decoupling inductor and in parallel with the tuning capacitor;
      a resistor connected in parallel with the diode; and
      at least one isolating inductor connected between the resistor and the diode; and
   a DC source coupled to the at least two decoupling points.

8. An RF surface coil apparatus according to claim 7, wherein the at least one isolating inductor is configured to RF isolate the resistor from the RF coil.

9. An RF surface coil apparatus according to claim 7, wherein the at least two decoupling points are configured to maintain a quality factor (Q) of the RF coil.

10. An RF surface coil apparatus to claim 9, wherein the resistor has a resistance value and the resistance value of the resistor in each decoupling point is the same.

11. An RF surface coil assembly apparatus to claim 7, wherein the resistor has a resistance value and the resistance value is selected to reduce a switching time of the RF coil.

12. A resonance assembly comprising:
   a superconducting magnet;
   a gradient coil assembly disposed within an inner diameter of the superconducting magnet;
   an RF body coil disposed within an inner diameter of the gradient coil assembly, the RF body coil configured to transmit RF excitation signals during a transmit mode;
   an RF surface coil disposed within an inner diameter of the RF body coil and near an imaging subject, the RF surface coil comprising a plurality of tuning capacitors and configured to receive MR signals emitted from the imaging subject during a receive mode;
   a decoupling circuit coupled to RF surface coil and configured to disable the RF surface coil during the transmit mode and enable the RF surface coil during the receive mode, the decoupling circuit comprising at least two decoupling points, each decoupling point associated with one of the plurality of tuning capacitors and comprising:
      a decoupling inductor connected in parallel with a tuning capacitor;
      a diode connected in series with the decoupling inductor and in parallel with the tuning capacitor;
      a resistor connected in parallel with the diode; and
      at least one isolating inductor connected between the resistor and the diode to isolate the resistor, and
   a DC source coupled to the at least two decoupling points.

13. A resonance assembly according to claim 12, further comprising an array of RF surface coils and a plurality of decoupling circuits, each decoupling circuit connected to one of the RF surface coils in the array of RF surface coils.

14. A resonance assembly according to claim 12, wherein the resistor has a resistance value and the resistance value is selected to reduce a switching time for the RF surface coil between the transmit mode and the receive mode.

* * * * *